US006345988B1

(12) United States Patent
Ketcham

(10) Patent No.: US 6,345,988 B1
(45) Date of Patent: Feb. 12, 2002

(54) INTER-CARD CONNECTION BETWEEN ADJACENTLY POSITIONED EXPANSION CARDS

(75) Inventor: Carl Ketcham, Taylorsville, UT (US)

(73) Assignee: 3Com Corporation, Santa Clara, CA (US)

( * ) Notice: Subject to any disclaimer, the term of this patent is extended or adjusted under 35 U.S.C. 154(b) by 0 days.

(21) Appl. No.: 09/267,964

(22) Filed: Mar. 12, 1999

(51) Int. Cl.[7] .............................. H01R 12/00; H05K 1/00
(52) U.S. Cl. ........................ 439/74; 439/259; 439/946
(58) Field of Search .......................... 439/131, 66, 188, 439/541.5, 259, 946, 74, 64, 928; 361/737

(56) References Cited

U.S. PATENT DOCUMENTS

| | | | |
|---|---|---|---|
| 5,183,404 A | 2/1993 | Aldous et al. ................. | 439/55 |
| 5,184,282 A | 2/1993 | Kaneda et al. ............... | 361/395 |
| 5,336,099 A | 8/1994 | Aldous et al. ............... | 439/131 |
| 5,338,210 A | 8/1994 | Beckham et al. ........... | 439/131 |
| 5,391,094 A | 2/1995 | Kakinoki et al. ........... | 439/638 |
| 5,457,601 A | 10/1995 | Georgopulos ............... | 361/686 |
| 5,513,074 A | 4/1996 | Ainsbury et al. ........... | 361/737 |
| 5,528,459 A | 6/1996 | Ainsbury et al. ........... | 361/737 |
| 5,547,401 A | 8/1996 | Aldous et al. ............... | 439/676 |
| 5,605,463 A | 2/1997 | MacGregor ................... | 439/64 |
| 5,608,607 A * | 3/1997 | Dittmer ....................... | 361/686 |
| 5,613,860 A * | 3/1997 | Banakis et al. ............... | 439/64 |
| 5,628,637 A * | 5/1997 | Pecone et al. ................. | 439/74 |
| 5,637,001 A * | 6/1997 | Nony et al. .................. | 439/131 |
| 5,643,001 A * | 7/1997 | Kaufman et al. ........... | 439/159 |
| 5,655,918 A * | 8/1997 | Soh ............................. | 439/159 |
| 5,716,221 A | 2/1998 | Kantner ....................... | 439/64 |
| 5,727,972 A | 3/1998 | Aldous et al. ............... | 439/655 |
| 5,773,332 A | 6/1998 | Glad ........................... | 439/344 |
| 5,775,923 A * | 7/1998 | Tomioka ...................... | 439/79 |
| 5,797,771 A | 8/1998 | Garside ...................... | 439/610 |
| 5,816,827 A | 10/1998 | Nelson et al. | |
| 5,816,832 A | 10/1998 | Aldous et al. ............. | 439/131 |
| 5,876,218 A * | 3/1999 | Liebenow et al. ........... | 439/74 |
| 5,988,511 A | 11/1999 | Schmidt et al. ............. | 435/492 |

OTHER PUBLICATIONS

PCMCIA (Personal Computer Memory Card International Association), The Worldwide Organization for Modular Peripherals, "Frequently Asked Questions about P Card Technology," www.pc–card.com/faq.htm, pp. 1–5 (date unknown).
PCMCIA (Personal Computer Memory Card International Association), The Worldwide Organization for Modular Peripherals, "PC Card Technology Primer," www.pc–card.com/pcccard.htm, pp. 1–3 (date unknown).
PCI (Peripheral Component Interconnect), "PCI Overview Class or CD," www.winteltraining.com/comppci.htm, p. 1 (1998). (No month).
IST Engineering, Ltd., Compact PCI Products for the OEM "About CompactPCT," www.iste.com/comppci.html, pp. 1–4 (date unknown).
PCMCIA (Personal Computer Memory Card International Association), The Worldwide Organization for Modular Peripherals, "SmartMedia Technology Primer," www.pc–card.com/smartmedia.htm, pp. 1–5 (date unknown).
PCMCIA (Personal Computer Memory Card International Association), The Worldwide Organization for Modular Peripherals, "Miniature Card Technology Primer," www.pc-card.com/miniaturecard.htm, pp. 1–6 (date unknown).

* cited by examiner

Primary Examiner—Lincoln Donovan
Assistant Examiner—Ryung S. Lee
(74) Attorney, Agent, or Firm—Workman, Nydegger & Seeley

(57) ABSTRACT

The present invention is an apparatus and method of connecting, combining and extending the functionality of adjacently stacked, modular expansion cards in electronic devices through the use of a novel electrical connection between the expansion cards. Preferred embodiments of the present invention are modifications of PC Card Standard expansion cards or other expansion devices which are commonly stacked adjacently and in close proximity in a host of portable computer. Specific embodiments of the present invention allow the use of multiple expansion cards which can communicate directly with each other and allow the use, by a second card, of connectors, antennas, cords, and other items located within a first card.

42 Claims, 4 Drawing Sheets

INTER-CARD CONNECTION BETWEEN ADJACENTLY POSITIONED EXPANSION CARDS

BACKGROUND OF THE INVENTION

1. The Field of the Invention

The present invention relates generally to the connection, combination and extension of adjacently stacked, modular expansion cards in electronic devices through the use of a novel electrical connection between the expansion cards. Preferred embodiments of the present invention relate more specifically to the connection, combination and extension of PC Card Standard expansion cards or expansion devices which are commonly stacked adjacently and in close proximity in a host portable computer. Specific embodiments of the present invention allow the use of multiple expansion cards which can communicate directly with each other and allow the use, by a second card, of connectors, antennas, cords, and other items located within a first card.

2. The Relevant Technology

Many computers, printers and other electronic devices utilize expansion cards to increase memory, add new features, increase capability and otherwise improve the functionality of the host device. Successful manufacturers in the computer industry allow for this increased functionality by providing expansion card slots in their products.

These slots are commonly constructed according to a known standard with well defined specifications so that third party expansion card developers may design products for the manufacturer's host computer or other device. One standard, commonly used in desktop computers at the present time, is the Peripheral Component Interconnect bus architecture (PCI). This standard, like many others, defines the physical constraints of a compliant card including overall size and physical attributes of the electrical connectors on the card. Electrical parameters are also defined so that industry participants may design products that will work effectively with other manufacturers' products.

The PCI standard is typically used in desktop computers to provide for the functional expansion of the host computer by allowing for the addition of modems, video cards, network adapters, sound cards, storage devices as well as other standard and customized features. In an ordinary desktop personal computer, the PCI bus architecture provides plenty of space around and between the expansion cards for wiring and interconnection of the cards. Simple ribbon connectors are commonly used for interconnection of PCI cards to other devices or other cards. While the PCI standard is common in bulky desktop computers, it is not typically suitable for smaller format devices such as laptop computers, notebook computers or Personal Digital Assistants (PDA's).

These smaller format computers and electronic devices compete to be the smallest, lightest and most portable while offering the most capability and expandability. Consequently, their expansion card formats are much smaller and more compact than those used for desktop computers.

One expansion card standard for smaller format computers is known as the PC Card Standard. The PC Card Standard is promulgated by the Personal Computer Memory Card International Association (PCMCIA) which publishes and maintains the standard. The PC Card Standard comprises physical specifications for expansion cards as well as electrical specifications and connector requirements. A PC Card Standard card has a width of 54.0 millimeters and a standard length of 85.6 millimeters. The thickness of PC Card Standard cards varies with the "type" of card. Thicknesses vary between 3.3 millimeters, 5.0 millimeters and 10.5 millimeters for Type I, II and III cards respectively. Currently, the Type I cards are used primarily for memory devices such as RAM, Flash, OTP, and SRAM cards. Type II cards are typically used for I/O devices such as data/fax modems, network adapters and mass storage devices. Type III PC Cards are used for thicker components such as rotating mass storage devices. All of the PC Card Standard compliant cards use a standard 68-pin connector to interface with the host device.

While the PC Card Standard serves well for a multitude of applications, it's size restrictions and connector standard can preclude some finctionality. One aspect of the PC Card Standard and other thin architecture standards that can be problematic is their connection to an external device or network. This is commonly encountered in Type II modems or network cards which must connect to RJ-11, RJ-45 or similar plugs. These industry standard plugs are thicker than the PC Card Standard cards so adapters must be used to accommodate the thicker plugs. One ingenious method for accommodating the RJ type plugs is the XJACK® manufactured by 3Com, Inc. of Salt Lake City, Utah. The XJACK® is generally a retractable jack which may retract into the PC Card Standard card or protrude from it exposing an aperture in its body which will accommodate a standard RJ type plug.

While the XJACK® provides an excellent connection to a PC Card Standard device, its retractable configuration can consume a large amount of real estate within the card. Other retractable connectors have similar problems. Various "alligator" type jacks also retract into the expansion card thereby taking up space and precluding the use of that space for other purposes.

This problem is exacerbated in combination cards which have multiple uses. A common combination card is the modem combined with a network adapter such as an Ethernet adapter. This type of combo card has a need for two external connections: one to connect the modem to a phone line; another to connect the network adapter to a network. This is typically accomplished with an RJ-11 jack and an RJ-45 jack on a desktop computer, but standard RJ jacks will not fit on thin architecture cards. An XJACK® for each connection would be necessary, however this is not always possible. The XJACK® works well on single use cards, but two XJACK'® can consume a prohibitive amount of space in a single thin architecture card such as the PC Card Standard cards, especially the Type I and II cards.

One method used to at least partially overcome this problem is the proprietary connector or "dongle." The dongle is a short cable fitted with a thin proprietary connector on one end which connects to a thin proprietary jack on a thin architecture card. The other end of the dongle is fitted with a housing which contains a standard RJ type jack. These dongles act as adapters to convert the cables with standard RJ plugs to the proprietary thin connectors which can be used with thin architecture cards. While the dongle provides an adequate connection, they are easily lost, tangled or damaged. The businessman stranded without a proprietary modem connection cable while on an important business trip quickly comprehends the drawbacks of the dongle concept.

In addition to the physical size restrictions imposed upon PC Card Standard cards and other thin architecture devices, the connector restrictions of these standards also inhibit some devices and combinations of device from conforming with the standards. The PC Card Standard requires a 68-pin connector with the function of each pin being designated in the standard.

Under Release 2.0 of the PCMCIA standards, in effect through 1994 and under which many currently used computers were designed, an 8 bit or 16 bit bus was used. Four ground pins, two power pins and up to three free signal pins were available. Under this standard, bandwidth is effectively restricted to about 20 MHz. Power, restricted to two pins, is also limited to around 3.3 watts. These restrictions come about as a result of the limited pin configuration.

The new PC Card Standard released in 1995 improves performance using 32-bit CardBus busmastering thereby increasing bandwidth to 33 MHz, however bandwidth and power are still limited by the connector pin configuration. Changing the existing pin configuration will almost certainly result in a design that is not backward-compatible with the present standard.

Various methods have been employed to overcome the physical size limitations and the electrical connection restrictions inherent in thin architecture expansion cards such as those conforming to the PC Card Standard.

One known method of overcoming the connection restrictions utilizes a modified socket or header within the host device which communicates with additional contacts on the top or bottom of the card near the connector end. The problem with this approach is that it requires a non-standard connector inside the host device. This approach also lacks backward-compatibility in that it cannot be implemented with current sockets.

Another attempted solution to the above-related problems is an end-mounted adapter which connects to two cards at once thereby combining them and at least partially overcoming some of the physical size limitations of the standard. This approach may effectively join two cards in order to increase the size limitation of a single device, but known methods of accomplishing this end all employ adapters or extensions which protrude outside the form factor established in the standard. This solution provides for devices that need more space, but most of these devices are bulky and their portions which extend outside the prescribed form factor often must be removed in order to store the host computer or device. That is, a host computer will not fit into its carrying case or other luggage while the protruding adapter is attached. This situation requires removal of the device from the computer after each use, making the device prone to loss or damage. Alternatively, a specialized carrying case may be used, however this is an added inconvenience and expense and makes the host device bulkier and more difficult to transport.

SUMMARY AND OBJECTS OF THE INVENTION

The present invention provides a means for expanding a single device or combination of devices from one standard format card into another standard format card. The present invention utilizes novel electrical connections between two or more standard cards in order to interconnect the circuitry and devices on the cards and allow hardware and circuitry on one card to be utilized by the other. This inter-card connectivity is achieved while substantially maintaining the prescribed form factor of the card standard.

Some embodiments of the present invention allow for the use of antennas, thin profile connectors such as the XJACK®, cord reels and electronic devices that may work in conjunction with the primary electronic device. Devices which may be used in the interconnecting cards of the present invention include, but are not limited to data/voice radios, AMPS or PCS cellular devices, CDPD or RAM data, IIS band modems, IEEE 802.11 wireless LAN and others.

Embodiments of the present invention comprise one or more electrical connections between one or more thin architecture expansion cards. Cards conforming to the PC Card Standard are used in the most common embodiments, however any thin architecture card or adjacently installed card can benefit from the novel connectors of the present invention.

In a typical embodiment of the present invention, a host computer or device has a series of card slots arranged adjacently so that expansion cards are stacked one atop the other with each card roughly forming a plane substantially parallel with those of the other cards. These slots may be disposed so as to stack the cards horizontally, vertically or in any other orientation so long as the cards are substantially parallel and in close proximity. A host device will have rails, guides or other structure to aid insertion of the cards and maintain the cards in a fixed position. The host device will also have an electrical connector, typically defined by a card standard, such as the 68-pin connector used under the PC Card Standard, for each card. This combination of guiding and retention structure and electrical connector comprises a card socket.

Thin architecture expansion cards have corresponding connectors that mate with those of the host device. The cards of the present invention also have interconnecting connectors which provide an electrical connection directly between the adjacent cards allowing the cards to communicate directly and share resources. The connectors or contacts of the present invention differ from known connection methods because they work well in the confined space between adjacent thin architecture cards. Known connectors such as ribbon cables, etc will not fit in such a confined space.

These interconnecting connectors may be formed by providing conductive contact areas or contacts along the top or bottom of a first card. An adjacent card will have protruding conductors oriented to align with the contacts or contact areas of the first card when the adjacent card is inserted into a slot adjacent to the first card. When both cards have been fully inserted into adjacent slots the protruding contacts of the adjacent card connect with the contact areas of the first card thereby completing their interconnection and allowing the two cards to communicate and share resources.

These connections, used between adjacent expansion cards with contacts, conductors or otherwise, may be referred to as inter-card contacts. The connection effectuated thereby may be referred to as inter-card connector.

It is to be understood that the interconnection of two expansion cards may allow one card to utilize another card's standard connection interface with the host device as well as resources on the card itself.

BRIEF DESCRIPTION OF THE DRAWINGS

In order that the manner in which the above-recited and other advantages and objects of the invention are obtained, a more particular description of the invention briefly depicted above will be rendered by reference to a specific embodiment thereof which is illustrated in the appended drawings. With the understanding that these drawings depict only a typical embodiment of the invention and are not therefore to be considered to be limiting of its scope, the invention will be described and explained with additional specificity and detail through the use of the accompanying drawings in which.

DETAILED DESCRIPTION OF THE PREFERRED EMBODIMENTS

Figure 1:
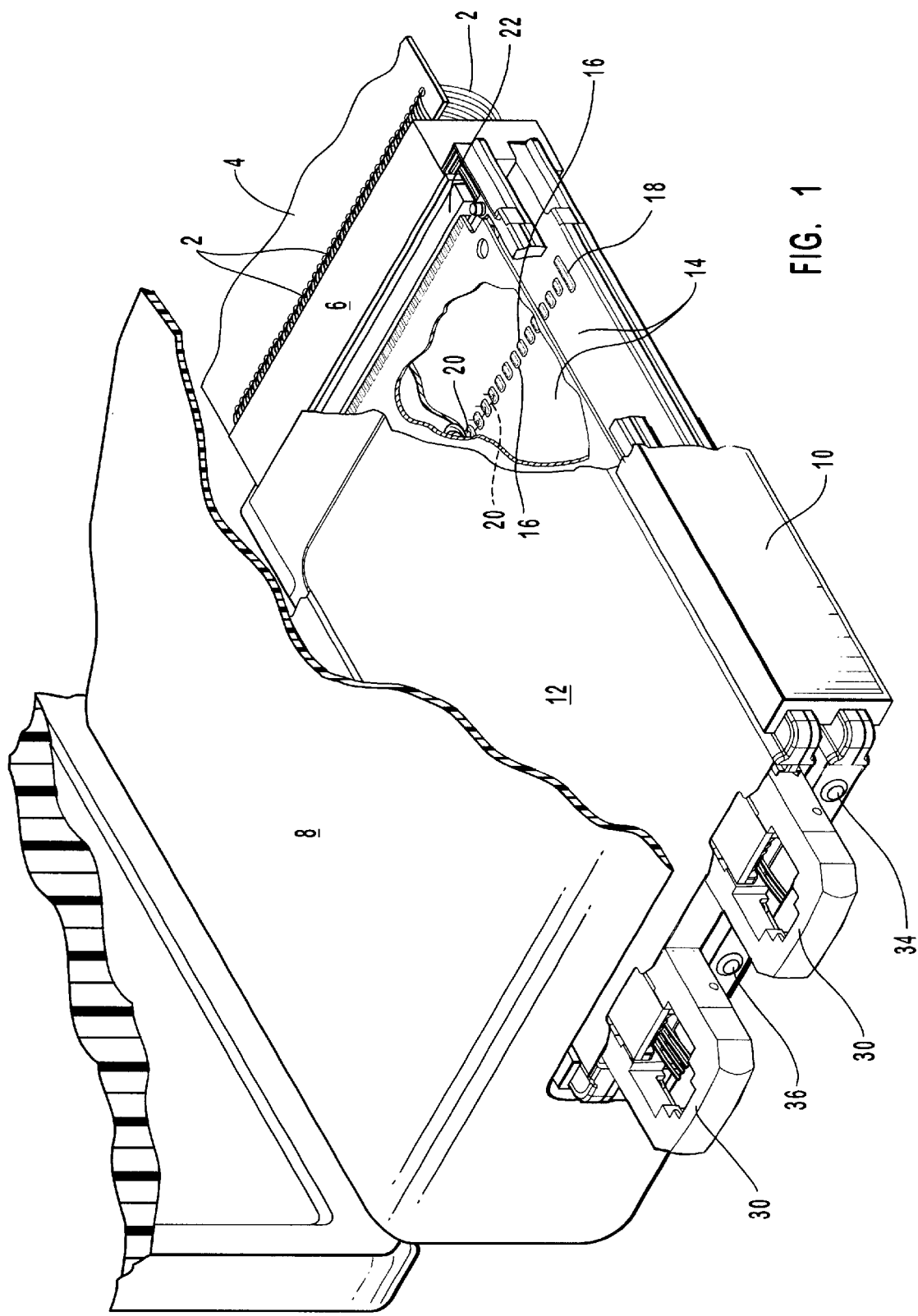
FIG. 1 is a perspective view of a preferred embodiment of the present invention, illustrating two expansion cards installed in a host device card socket, with portions of the host device and expansion cards cutaway to show the electrical contact areas of the expansion cards.

The figures listed above are expressly incorporated as part of this detailed description.

It will be readily understood that the components of the present invention, as generally described and illustrated in the Figures herein, could be arranged and designed in a wide variety of different configurations. Thus, the following more detailed description of the embodiments of the system and apparatus of the present invention, as represented in FIGS. 1 through 5, is not intended to limit the scope of the invention, as claimed, but it is merely representative of the presently preferred embodiments of the invention.

The currently preferred embodiments of the present invention will be best understood by reference to the drawings, wherein like parts are designated by like numerals throughout.

A preferred embodiment of the present invention may be embodied in a thin architecture format such as a PC Card Standard card. The PC Card Standard is promulgated by the Personal Computer Memory Card International Association (PCMCIA). The PCMCIA PC Card Standard identifies three primary card types: Type I, II and III. These types correspond to physical dimension restrictions of 85.6 mm (length) ×54.0 mm (width) and thicknesses of 3.3 mm, 5.0 mm and 10.5 mm respectively. The PC Card Standard also defines a 68-pin electrical connector used to connect conforming cards to a host device. These cards are well known in the art.

While not required by the PC Card Standard, most manufacturers utilize a stacked socket configuration wherein PC Card sockets are stacked adjacently so that two or more cards may be received in a stack. In this orientation, the top and bottom surfaces of the cards form substantially parallel planes which may be oriented vertically, horizontally or otherwise. When this socket stacking occurs, spacing of the sockets becomes a factor as the thickness of card varies with the type designation of card used. This spacing factor is not, however, a problem as the majority of manufacturers today use sockets spaced for Type II cards. Consequently, embodiments of the present invention which conform to the Type II PC Card Standard form factor will work well in most applications despite varying card and host computer manufacturing.

As well as card thickness, spacing between cards is also a factor. Different manufacturers may manufacture PC Card Standard or other sockets with slightly different card spacing between the cards. While the spacing dimension may vary between manufacturers, it only varies within a small range due to the necessity for a compact system. Embodiments of the present invention overcome this problem with flexible contacts that protrude a sufficient distance to contact the other card while being sufficiently flexible to flex out of the way when spacing is tight. Some embodiments of the present invention may comprise retractable connectors that can contact a second card when desired or may be retracted when added functionality is not desired or when tight spacing does not permit card insertion while contacts are protruding.

In a preferred embodiment of the present invention, a host electronic device 8 contains expansion card slots for receiving multiple expansion cards 12 & 14 in close adjacency. Host device 8 comprises an electrical connector 6 to which expansion cards 12 & 14 are electrically connected via a connector 22 such as 68-pin connector or other suitable connector. Electrical connector 6 is electrically connected 2 through wires, ribbon cable, direct soldering or otherwise to the host device 8 preferably to the printed circuit board (PCB) 4 or other hardware of the host device 8. This connection allows an expansion card 12 or 14 to communicate with the host device and/or derive power therefrom.

In this preferred embodiment, the host device 8 is a portable computer such as a laptop computer, notebook computer, sub-notebook computer, Personal Digital Assistant (PDA) or other computing device.

The electrical connectors 6 of the host device 8 are typically oriented in conjunction with guide structures 10 which orient the card so that it aligns properly with the electrical connector 6. Guide structures 10 may also secure expansion cards into the host device 8 so they do not slide or fall out. The electrical connectors 6 of this embodiment of the present invention do not need to be modified from the standard configuration used for known expansion cards. This allows the novel cards of the present invention to be backwards compatible, that is, they may be used with connectors and slots manufactured under present standards without modification of the slots or connectors.

In this embodiment of the present invention, a contact card 14 comprises inventive electrical contact areas 16 & 18 which are electrically coupled to circuitry within the card. Contact areas 16 & 18 have exposed conductive areas 50 which may be used to connect the card to additional circuitry in an adjacent card. An electrical connection to an adjacent conductor card 12 is made by way of corresponding conductors 20 which protrude from the conductor card 12 in alignment with contact areas 16 & 18 so that conductors 20 touch contact areas 16 & 18 thereby forming an electrical connection when contact card 14 and conductor card 12 are inserted into adjacent slots in a host device 8.

Contact areas 16 & 18 may be arranged in a line so that all contacts areas 16 connect to their corresponding conductors 20 simultaneously when the second card is inserted. Contact areas 18 may also be elongated so as to effectuate an electrical connection with the mating card before other contact areas 16. The physical arrangement and orientation of the contact areas 16 & 18 may be altered in a variety of ways to accomplish a timed contact sequence in order to achieve a "hot boot" of the two mating cards or to otherwise customize the electrical connection procedure to a specific application.

In particular embodiments of the present invention, one of the mating cards may contain a retractable connector 30, such as an XJACK® connector, but it will be appreciated that some embodiments may contain multiple XJACK® connectors for connection to different connector plugs. For example, a card may comprise an XJACK® for connection with a typical RJ-45 plug in conjunction with a network adapter and an XJACK® for connection to a typical RJ-11 plug in conjunction with a modem. This multi-connector card might mate with a combination modem/network adapter to provide connection options. The XJACK® connectors may be the primary connectors for the card or act as alternative connectors when other connectors 36 & 34 are provided.

It should be noted that only one of the mating cards need connect with the host device. A mating card may provide connectors, antennas, cords, other circuitry or accessories to another card without, itself, connecting to the host. Conversely, both cards may connect with the host in order to provide additional bandwidth, speed or other functions by way of the additional host connection.

Figure 2:
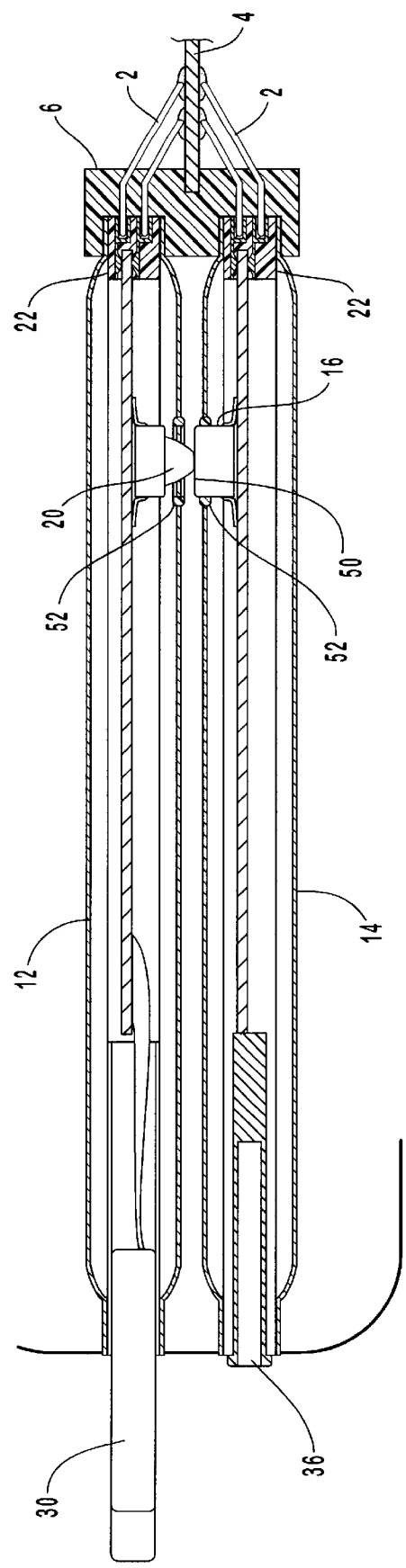
FIG. 2 is a longitudinal cross-sectional side view of another preferred embodiment of the present invention.

The inventive nature of the present invention may be more fully understood by reference to FIG. 2 in which conductors 20 are shown in section. Conductors 20 protrude from one card in alignment with contact areas 16 so that the contact areas and the corresponding conductors physically touch to allow electrical communication between the two cards. Conductors 20 may take any shape or form which may effectively complete an electrical connection between the mating cards. Conductors 20 may be spring-loaded to bias them against the mating card. This can be achieved, for example and not by way of limitation, with flexible conductors or with springs or elastomeric biasing means.

Figure 3A:
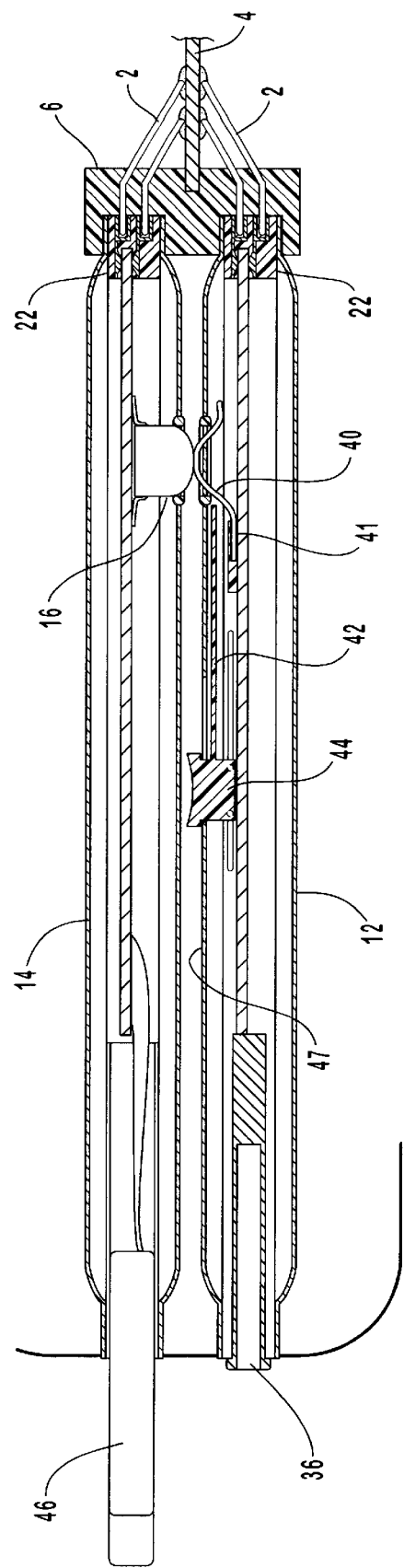
FIG. 3A is a longitudinal cross-sectional side view of yet another preferred embodiment of the present invention, illustrating retractable flexible conductors in an extended position.
Figure 3B:
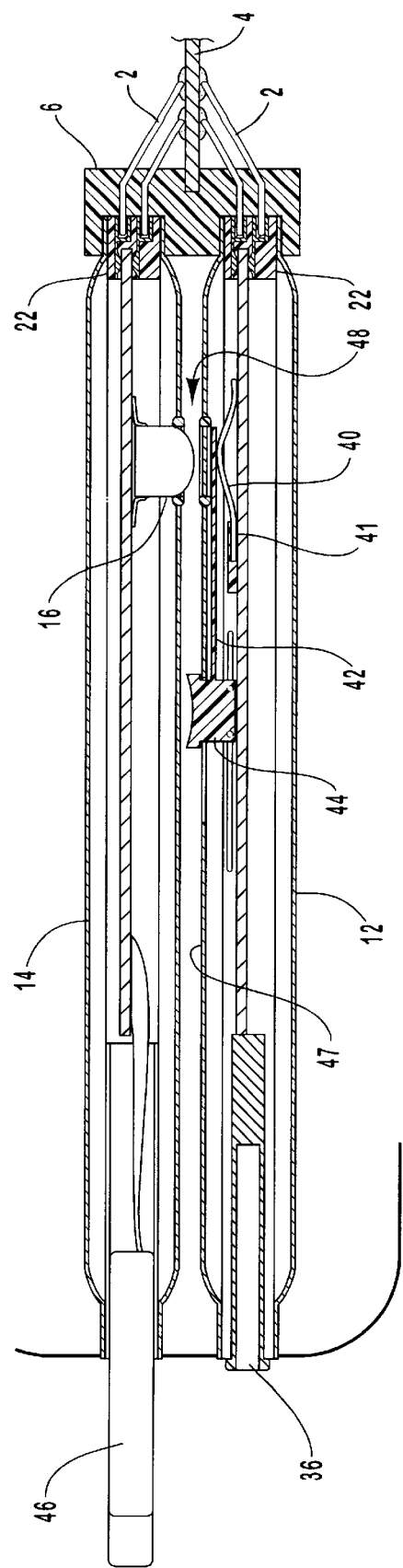
FIG. 3B is a longitudinal cross-sectional side view of the embodiment shown in FIG. 3A, illustrating the retractable flexible conductors in a retracted position.
Figure 4:
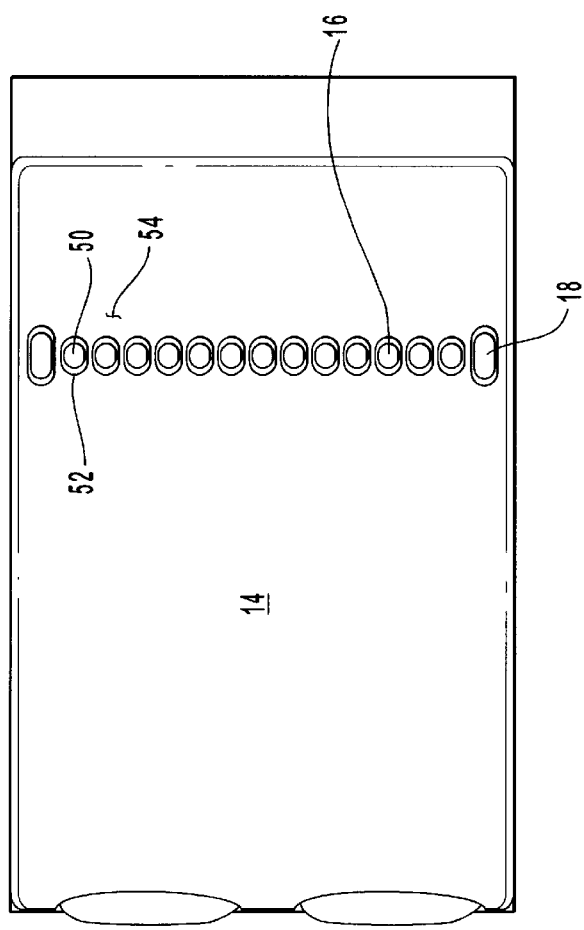
FIG. 4 is a plan view of an expansion card of still another preferred embodiment of the present invention, illustrating the conductive areas and insulator rings.

As seen in FIGS. 3A and 3B, the conductors 20 may also be retractable into the conductor card 12. This method is preferable when card slots are arranged so as to place adjacent cards very close together or in contact. One method of retracting conductors, given by way of example and not limitation, employs a flexible arm conductor 40 connected to a PCB or other circuitry at its base 41. In this particular embodiment, a non-conductive or insulated sheet 42 is movably placed within the conductor card 12. This non-conductive sheet 42 may be positioned so as to allow flexible arm conductors 40 to extend out of conductor card 12 allowing conductors 40 to come into contact with contact areas 16 on a contact card 14. When non-conductive sheet 42 is slid toward flexible arm conductors 40, flexible arm conductors 40 are forced into a retracted position 48 within the connector card 12 and the conductors are protected by non-conductive sheet 42 until they are again extended.

Non-conductive sheet 42 may be manually operated through the use of a finger manipulated tab 44 which may be located on a face 47 of conductor card 12 or located along an edge of card 12 so that it may be manipulated while card 12 is inserted in a host device 8. Non-conductive sheet 42 is only one example of a retraction mechanism. Other devices may be employed to effectuate retraction and extension of conductors 20 or flexible arm conductors 40 through the use of mechanical linkages and devices as well electric and electronic methods including, but not limited to, motors, servo-motors and electromagnetic means.

Operation of the retraction means may be controlled mechanically or otherwise and may be achieved through manual initiation through a mechanical device or hardware or software selection or by automatic methods using mechanical or electrical initiation.

Some embodiments of the present invention utilize a metallic housing on the expansion card. This conductive housing must be insulated from the contact areas so as to avoid short-circuiting between contact areas through the housing surface. This protection may be achieved through the use of insulator rings 52 which surround contact areas 16 & 18 and insulate the contact areas from the conductive housing material.

Figure 5:
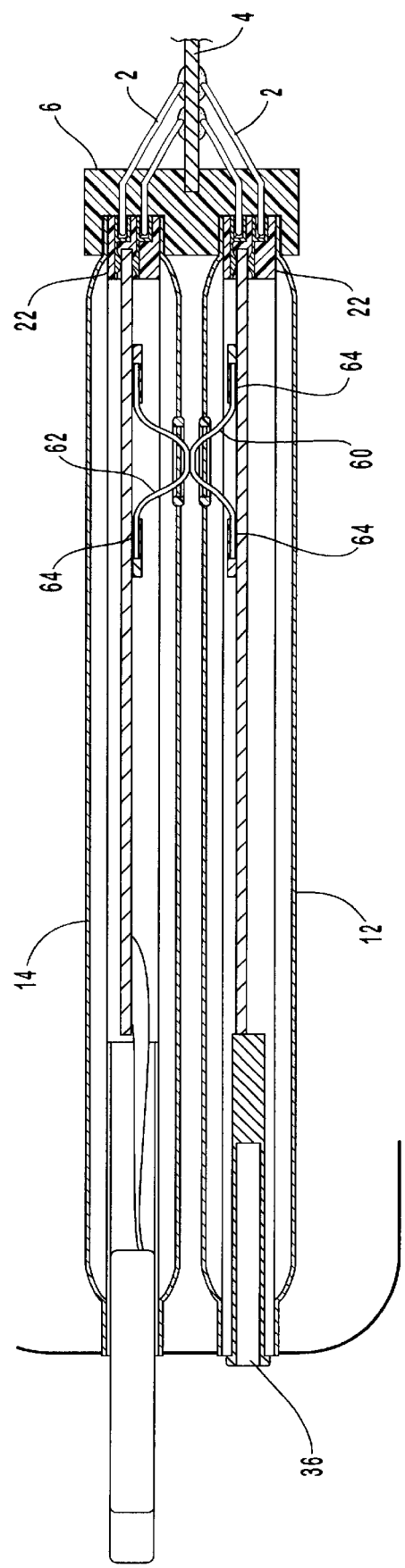
FIG. 5 is a longitudinal cross-sectional side view of another preferred embodiment of the present invention, illustrating protruding contacts and protruding conductors.

In an alternative embodiment of the present invention illustrated in FIG. 5, the contact card 14 may have protruding contacts 62 and conductor card 12 may include protruding conductors 64 which complete an electrical connection between the two cards. These contacts and conductors may also be retractable and are typically biased toward contact to form a flexible interference fit.

Due to the widespread acceptance of the PC Card Standard among computer manufacturers and expansion card manufacturers, a preferred embodiment of the present invention is implemented in a PC Card Standard format. Because the Type II card is most commonplace and myriad host device sockets are designed for multiple Type II cards, the Type II form factor is preferable for embodiments of the present invention.

The present invention may be embodied in other specific forms without departing from its spirit or essential characteristics. The described embodiments are to be considered in all respects only as illustrative, and not restrictive. The scope of the invention is, therefore, indicated by the appended claims, rather than by the foregoing description. All changes which come within the meaning and range of equivalency of the claims are to be embraced within their scope.

What is claimed is:

1. An apparatus comprising:
   a first expansion card including an upper surface, a lower surface, a front end and a rear end, the first expansion card including a longitudinal length extending between the front end and the rear end of the card, the first expansion card being sized and configured to be independently slidable along a longitudinal axis into a socket of two or more adjacent sockets in a host device;
   a plurality of contact areas disposed on a lower surface of the first expansion card;
   a second expansion card including an upper surface, a lower surface, a front end and a rear end, the second expansion card including a longitudinal length extending between the front end and the rear end of the card, the second expansion card being sized and configured to be independently slidable along a longitudinal axis into an adjacent socket in the host device; and
   a plurality of conducting portions disposed on an upper surface of the second expansion card, the contact areas and the conducting portions being sized and configured to allow the first expansion card and the second expansion card to be slidably connected generally along the longitudinal axis to allow direct electrical communication to be established between the first expansion card and the second expansion card.

2. The apparatus as in claim 1, wherein one or more of the plurality of contact areas have a first length and one or more of the plurality of contact areas have a second length.

3. The apparatus as in claim 2, wherein the contact areas having the first length are adapted to allow electrical communication to be established between the first expansion card and the second expansion card before the contact areas having the second length are adapted to allow electrical communication to be established between the first expansion card and the second expansion card.

4. The apparatus as in claim 1, further comprising a printed circuit board disposed within the first expansion card, wherein the plurality of contact areas are disposed on an outer surface of the printed circuit board.

5. The apparatus as in claim 1, wherein the plurality of contacts are located in a recess located in the outer surface of the first expansion card.

6. The apparatus as in claim 1, wherein the plurality of contacts are positioned generally parallel to the outer surface of the first expansion card.

7. The apparatus as in claim 1, wherein the plurality of contacts protrude outwardly from the outer surface of the first expansion card.

8. The apparatus as in claim 1, wherein one or more of the plurality of contacts are sized and configured to flexibly deform.

9. The apparatus as in claim 1, further comprising an insulator ring disposed about one or more of the plurality of contacts.

10. The apparatus as in claim 1, further comprising a first position wherein the plurality of contacts protrude outwardly from an outer surface of the first expansion card and a second position wherein the plurality of contacts do not protrude outwardly from an outer surface of the first expansion card.

11. The apparatus as in claim 1, wherein the plurality of conducting portions are flexible and protrude outwardly beyond the outer surface of the second expansion card.

12. The apparatus as in claim 1, wherein the plurality of conducting portions further comprise flexible arms that are electrically connected to a printed circuit board disposed within the second expansion card.

13. The apparatus as in claim 1, further comprising a first position wherein the plurality of conducting portions protrude outwardly from an outer surface of the second expansion card and a second position wherein the plurality of conducting portions do not protrude outwardly from an outer surface of the second expansion card.

14. The apparatus as in claim 1, wherein one or more of the plurality of conducting portions have a first length and one or more of the plurality of conducting portions have a second length.

15. The apparatus as in claim 14, wherein the conducting portions having the first length are adapted to allow electrical communication to be established between the first expansion card and the second expansion card before the conducting portion having the second length are adapted to allow electrical communication to be established between the first expansion card and the second expansion card.

16. The apparatus as in claim 1, further comprising a printed circuit board disposed within the second expansion card, wherein the plurality of conducting portions are disposed on an outer surface of the printed circuit board.

17. The apparatus as in claim 1, further comprising an insulator ring disposed about one or more of the plurality of conducting portions.

18. The apparatus as in claim 1, wherein the first expansion card is adapted to be inserted into a socket in a host device and the second expansion card is adapted to be inserted into an adjacent socket.

19. The apparatus as in claim 1, wherein the first expansion card and the second expansion card are independently insertable and removable from the host device.

20. An apparatus comprising:
a first expansion card including an upper surface, a lower surface, a front end and a rear end, the first expansion card including a longitudinal length extending between the front end and the rear end of the card;
a plurality of contact areas disposed on an outer surface of the first expansion card;
a second expansion card including an upper surface, a lower surface, a front end and a rear end, the second expansion card including a longitudinal length extending between the front end and the rear end of the card; and
a plurality of conducting portions disposed on an outer surface of the second expansion card, the contact areas and the conducting portions being sized and configured to allow the first expansion card and the second expansion card to be slidably connected generally along a longitudinal axis to allow electrical communication to be established between the first expansion card and the second expansion card;
wherein the plurality of contact areas are retractable within the first expansion card.

21. An apparatus comprising:
a first expansion card including an upper surface, a lower surface, a front end and a rear end, the first expansion card including a longitudinal length extending between the front end and the rear end of the card;
a plurality of contact areas disposed on an outer surface of the first expansion card;
a second expansion card including an upper surface, a lower surface, a front end and a rear end, the second expansion card including a longitudinal length extending between the front end and the rear end of the card; and
a plurality of conducting portions disposed on an outer surface of the second expansion card, the contact areas and the conducting portions being sized and configured to allow the first expansion card and the second expansion card to be slidably connected generally along a longitudinal axis to allow electrical communication to be established between the first expansion card and the second expansion card;
wherein the plurality of conducting portions are retractable within the second expansion card.

22. An apparatus comprising:
a first expansion card including an upper surface, a lower surface, a front end and a rear end, the first expansion card including a longitudinal length extending between the front end and the rear end of the card;
a plurality of contact areas disposed on an outer surface of the first expansion card;
a second expansion card including an upper surface, a lower surface, a front end and a rear end, the second expansion card including a longitudinal length extending between the front end and the rear end of the card;
a plurality of conducting portions disposed on an outer surface of the second expansion card, the contact areas and the conducting portions being sized and configured to allow the first expansion card and the second expansion card to be slidably connected generally along a longitudinal axis to allow electrical communication to be established between the first expansion card and the second expansion card; and
a tab connected to the second expansion card, the tab including a non-conductive member that is used to move the conducting portions between a first position and a second position; wherein the second expansion card is capable of electrically communicating with the first expansion card in the first position and is not capable of electrically communicating with the first expansion card in the second position.

23. An expansion card being sized and configured to be inserted along a longitudinal axis into a socket of two or more adjacent sockets in a host device, the expansion card being sized and configured to allow another expansion card to be independently inserted and removed from an adjacent socket, the expansion card being at least partially disposed within the socket when it is received within the host device, the expansion card comprising:

a card body including an upper surface, a lower surface, a front end and a rear end, the card body including a longitudinal length extending between the front end and the rear end of the card;

a connector located at the front end of the card body, the connector being sized and configured to electrically connect the expansion card to the host device; and a plurality of contact areas disposed on the lower surface of the card body, the plurality of contact areas being sized and configured to allow the other expansion card to be independently slidable into and removable from the adjacent socket in the host device along the longitudinal axis, the plurality of contact areas allowing direct electrical communication to be established between the adjacent expansion cards.

24. An expansion card being sized and configured to be inserted along a longitudinal axis into a socket of two or more adjacent sockets in a host device, the expansion card being sized and configured to allow another expansion card to be independently inserted and removed from an adjacent socket, the expansion card being at least partially disposed within the socket when it is received within the host device, the expansion card comprising:

a card body including an upper surface, a lower surface, a front end and a rear end, the card body including a longitudinal length extending between the front end and the rear end of the card;

a connector located at the front end of the card body, the connector being sized and configured to electrically connect the expansion card to the host device; and a plurality of conducting portions disposed on the upper surface of the card body, the plurality of conducting portions being sized and configured to allow the other expansion card to be independently slidable into and removable from the adjacent socket in the host device along the longitudinal axis, the plurality of conducting portions allowing direct electrical communication to be established between the adjacent expansion cards.

25. A communication system that allows two communication cards to directly communicate when the communication cards are slidably inserted into adjacent card slots in a host device, the communication system comprising:

a first communication card including an upper surface, a lower surface, a front end and a rear end, the first communication card including a longitudinal length extending between the front end and the rear end of the card;

a plurality of contact areas disposed on the upper surface of the first communication card;

a second communication card including an upper surface, a lower surface, a front end and a rear end, the second communication card including a longitudinal length extending between the front end and the rear end of the card; and a plurality of conducting portions disposed on the lower surface of the second communication card;

wherein the first and second communication cards are independently insertable into the adjacent card slots in the host device;

wherein the contact areas and the conducting portions are sized and configured to allow the first communication card and the second communication card to be slidably positioned along a longitudinal axis; and wherein the contact areas and the conducting portions allow direct electrical communication to be established when the communication cards are received within the adjacent slots in the host device.

26. The communication system as in claim 25, wherein the plurality of contact areas flexibly deform to allow the first and second communication cards to be independently inserted and removed from the adjacent card slots.

27. The communication system as in claim 25, wherein the plurality of conducting portions flexibly deform to allow the first and second communication cards to be independently inserted and removed from the adjacent card slots.

28. The communication system as in claim 25, wherein the plurality of contact areas are retractable within the first communication card.

29. The communication system as in claim 25, wherein the plurality of conducting portions are retractable within the second communication card.

30. The communication system as in claim 25, further comprising a tab connected to the second communication card, the tab including a non-conductive member that is used to move the conducting portions between a first position and a second position, wherein the second expansion card is capable of electrically communicating with the first expansion card in the first position and is not capable of electrically communicating with the first expansion card in the second position.

31. The communication system as in claim 25, wherein one or more of the plurality of conducting portions have a first length and one or more of the plurality of conducting portions have a second length.

32. The communication system as in claim 31, wherein the conducting portions having the first length are adapted to allow electrical communication to be established between the first expansion card and the second expansion card before the conducting portion having the second length are adapted to allow electrical communication to be established between the first expansion card and the second expansion card.

33. A communication card that is slidably insertable along a longitudinal axis into a card slot of a pair of adjacent card slots in a host device, the communication card comprising:

a card body including an upper surface, a lower surface, a front end and a rear end;

a connector located at the front end of the card body, the connector being sized and configured to electrically connect the communication card to the host device; and a plurality of contact areas disposed on the upper surface of the card body, the plurality of contact areas being sized and configured to allow another communication card with a corresponding plurality of conducting portions on a lower surface to be independently slidable along the longitudinal axis into an adjacent slot in the host device, the plurality of contact areas and the plurality of conducting portions being sized and configured to allow direct electrical communication between the adjacent communication cards.

34. A communication card that is slidably insertable along a longitudinal axis into a card slot of a pair of adjacent card slots in a host device, the communication card comprising:

a card body including an upper surface, a lower surface, a front end and a rear end;

a connector located at the front end of the card body, the connector being sized and configured to electrically connect the communication card to the host device; and a plurality of conducting portions disposed on the upper surface of the card body, the plurality of conducting portions being sized and configured to allow another communication card with a corresponding plurality of contact areas on an upper surface to be independently slidable along the longitudinal axis into an adjacent slot in the host device, the plurality of conducting portions and the plurality of contact areas being sized and configured to allow direct electrical communication between the adjacent communication cards.

35. A communication system for a host device that includes adjacent communication card slots, the communication system comprising:

a first communication card including an upper surface, a lower surface, a front end and a rear end, the first communication card being capable of being inserted into a first card slot of the adjacent card slots;

a plurality of contact areas disposed on the lower surface of the first communication card;

a second communication card including an upper surface, a lower surface, a front end and a rear end, the second communication card being capable of being inserted into a second card slot of the adjacent card slots; and a plurality of conducting portions disposed on the upper surface of the second communication card, the plurality of conducting portions and the plurality of contact areas being sized and configured to allow the first communication card and the second communication card to be independently inserted into the adjacent card slots, the plurality of conducting portions and the plurality of contact areas being sized and configured to allow direct electrical communication between the first communication card and the second communication card.

36. The communication system as in claim 35, wherein the plurality of contact areas flexibly deform to allow the first and second communication cards to be independently inserted and removed from the adjacent card slots.

37. The communication system as in claim 35, wherein the plurality of conducting portions flexibly deform to allow the first and second communication cards to be independently inserted and removed from the adjacent card slots.

38. The communication system as in claim 35, wherein the plurality of contact areas are retractable within the first communication card.

39. The communication system as in claim 35, wherein the plurality of conducting portions are retractable within the second communication card.

40. The communication system as in claim 35, further comprising a tab connected to the second communication card, the tab including a non-conductive member that is used to move to conducting portions between a first position and a second position, wherein the second expansion card is capable of electrically communicating with the first expansion card in the first position and is not capable of electrically communicating with the first expansion card in the second position.

41. The communication system as in claim 35, wherein one or more of the plurality of conducting portions have a first length and one or more of the plurality of conducting portions have a second length.

42. The communication system as in claim 41, wherein the conducting portions having the first length are adapted to allow electrical communication to be established between the first expansion card and the second expansion card before the conducting portion having the second length are adapted to allow electrical communication to be established between the first expansion card and the second expansion card.

* * * * *